(12) United States Patent
Ryu et al.

(10) Patent No.: US 8,203,183 B2
(45) Date of Patent: Jun. 19, 2012

(54) ELECTROSTATIC DISCHARGE DIODE

(75) Inventors: Jun-Hyeong Ryu, Incheon (KR); Taeg-Hyun Kang, Icheon (KR); Moon-Ho Kim, Shiheung (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 371 days.

(21) Appl. No.: 12/556,957

(22) Filed: Sep. 10, 2009

(65) Prior Publication Data

US 2010/0065884 A1 Mar. 18, 2010

(30) Foreign Application Priority Data

Sep. 12, 2008 (KR) .......................... 10-2008-0090420

(51) Int. Cl.
*H01L 23/62* (2006.01)
(52) U.S. Cl. ................. 257/355; 257/356; 257/E27.073
(58) Field of Classification Search .................... 257/355
See application file for complete search history.

(56) References Cited

U.S. PATENT DOCUMENTS

| | | | |
|---|---|---|---|
| 5,468,984 A * | 11/1995 | Efland et al. .................. 257/356 |
| 5,661,066 A | 8/1997 | Takemoto et al. | |
| 6,046,480 A | 4/2000 | Matsumoto et al. | |
| 6,538,266 B2 * | 3/2003 | Lee et al. ...................... 257/173 |
| 6,657,273 B2 | 12/2003 | Skocki | |
| 6,870,202 B2 | 3/2005 | Oka | |
| 7,026,705 B2 | 4/2006 | Yamamoto et al. | |
| 7,195,958 B1 | 3/2007 | Huang et al. | |
| 7,525,779 B2 * | 4/2009 | Chen et al. ..................... 361/56 |

* cited by examiner

*Primary Examiner* — Jerome Jackson, Jr.
(74) *Attorney, Agent, or Firm* — Okamoto & Benedicto LLP (57) ABSTRACT

The present invention relates to an electrostatic discharge diode. The electrostatic discharge diode according to exemplary embodiment of the present invention includes: an N-type well formed on a substrate; an n− region formed on the N-type well; a plurality of p− regions penetrated and formed in the n− region; a plurality of n+ regions penetrated and formed in a first layer in which the n− region and a plurality of the p− regions are formed; a plurality of n+ regions penetrated and formed in a first layer in which the n− region and a plurality of the p− regions are formed; and a plurality of p+ regions penetrated and formed in the first layer, wherein a first n+ region among a plurality of the n+ regions and a first p+ region corresponding to the first n+ region are penetrated and formed in each other region of the corresponding first p− region among a plurality of the p− regions.

20 Claims, 9 Drawing Sheets

ELECTROSTATIC DISCHARGE DIODE

CROSS-REFERENCE TO RELATED APPLICATION

This application claims priority to and the benefit of Korean Patent Application No. 10-2008-0090420 filed in the Korean Intellectual Property Office on Sep. 12, 2008, the entire contents of which are incorporated herein by reference.

BACKGROUND OF THE INVENTION (a) Field of the Invention

The present invention relates to an electrostatic discharge diode for protecting a semiconductor circuit from static electricity or stress input to the semiconductor circuit.

(b) Description of the Related Art

An electrostatic discharge diode (hereafter, ESD) of a prior semiconductor circuit has one trigger voltage for electrostatic discharge clamping. That is, when a voltage generated by static electricity (hereafter called "electrostatic voltage") is larger than the trigger voltage, the electrostatic discharge diode is turned on and the electrostatic voltage is discharged. Then, the electrostatic voltage input to the semiconductor circuit is not larger than the trigger voltage and electrostatic voltage is clamped as the trigger voltage. Accordingly, for protecting the semiconductor circuit, a low voltage diode having a low trigger voltage can be used. When a high voltage diode having a high trigger voltage is used, the semiconductor circuit can be damaged before the electrostatic voltage reaches the trigger voltage. Since the low voltage diode has a high dopant concentration, an electrostatic discharge threshold voltage is low and the low voltage diode is suitable for discharging the electrostatic voltage. However, in the low voltage diode, when an electrical surge occurs, since a sustaining voltage of the low voltage diode is very low, a dielectric breakdown of the semiconductor circuit can occur because of the electrical surge. A sustaining voltage is a voltage difference applied between an anode and a cathode of a diode just before the diode is destroyed by the electrical surge. On the other hand, since the high voltage diode has a low dopant concentration, an electrostatic discharge threshold voltage is rather high and the diode is not suitable for discharging the electrostatic voltage. However, in the high voltage diode, when an electrical surge occurs, since the sustaining voltage of the high voltage diode is high, a dielectric breakdown of the semiconductor circuit by an electrical surge can be prevented. As stated above, there are problems that the high concentration dopant diode is weak to an electrical surge and the low concentration dopant diode is not suitable for discharging the electrostatic voltage. The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an electrostatic discharge diode having advantages of protecting a semiconductor circuit from an electrical surge as well as an electrostatic discharge to solve the above-mentioned problems. In one aspect of the present invention, an electrostatic discharge diode includes: a N-type well formed on a substrate; a n− region formed on the N-type well; a plurality of p− regions penetrated and formed in the n− region; a plurality of n+ regions penetrated and formed in a first layer in which the n− region and a plurality of the p− regions are formed; and a plurality of p+ regions penetrated and formed in the first layer, wherein a first n+ region among a plurality of n+ regions and a first p+ region corresponding to the first n+ region are penetrated and formed in each other region of the corresponding first p− region among a plurality of the p− regions. A plurality of the n+ regions are penetrated and formed in the n− region and the corresponding p− region among a plurality of the p− regions, and a plurality of the p+ regions are penetrated and formed in the n− region and the corresponding p− region among a plurality of the p− regions. A first diode is formed between the first p− region and the first n+ region, and a second diode is formed between the first p− region and the n− region. A third diode is formed between the second p+ region that is near the first n+ region and the n− region, and a fourth diode is formed between the second p− region in which some of the second p+ regions are penetrated and formed and the n− region. A trigger voltage at the first diode is higher than a trigger voltage at the third diode, which is higher than trigger voltages at the second and fourth diode. The first p+ region is connected with the second p+ region. A first resistor is formed between the first n+ region and the n− region, and a second resistor is formed between the first p+ region and the first p− region. In another aspect of the present invention, an electrostatic discharge diode includes: an N-type well formed on a substrate; an n− region formed on the N-type well; a plurality of p− regions penetrated and formed in the n− region; a plurality of n+ regions penetrated and formed in a first layer in which the n− region and a plurality of the p− regions are formed; and a plurality of p+ regions penetrated and formed in the first layer, wherein a plurality of the n+ regions are penetrated and formed in the n− region and the corresponding p− region among a plurality of the p− regions, and a plurality of the p+ regions are respectively formed in the corresponding p− region among a plurality of the p− regions. A first diode is formed between the first p− region and the first n+ region, and a second diode is formed between the first p− region and the n− region. A third diode is formed between the second p− region, in which the second p+ region near the first n+ region is formed, and the n− region. A trigger voltage of the first diode is higher than trigger voltages of the second and third diodes. The first p+ region and the second p+ region are connected to each other. A first resistor is formed between the first p+ region and the first p− region. In another aspect of the present invention, an electrostatic discharge diode includes an N+ BL (blocking layer) formed on a substrate; a plurality of n− regions formed on the N+ BL; a plurality of p− regions formed on the N+ BL and alternately formed with a plurality of the n− regions in the horizontal direction; a plurality of n+ regions penetrated and formed in a first layer in which the n− region and a plurality of the p− regions are formed; and a plurality of p+ regions penetrated and formed in the first layer, wherein one among a plurality of the n+ regions is formed on the N+ BL. A first n+ region among the a plurality of the n+ regions is formed from a corresponding first n− region among a plurality of the n− regions to a first p− region that is near the first n− region. A first diode is formed between the first p− region and the first n+ region, and a second diode is formed between the first p− region and the N+ BL. A first p+ region, which is near the first n+ region among a plurality of the p− regions, is formed from another second n− region near the first p− region to the first p− region, and another second p+ region corresponding to the first n+ region among a plurality of the p+ regions is formed from another second p− region near the first n− region to the first n− region. A third diode is formed between the second p+ region and the first n− region, and a fourth diode is formed between the second p− region and the N+ BL. A trigger voltage of the first diode is higher than a trigger voltage of the third diode, which is higher than trigger voltages of the second and fourth diode. The first p+ region and the second p+ region are connected to each other. The electrostatic discharge diode protecting a semiconductor circuit from not only an electrostatic discharge but also an electrical surge is provided.

DETAILED DESCRIPTION OF THE EMBODIMENTS

Figure 1:
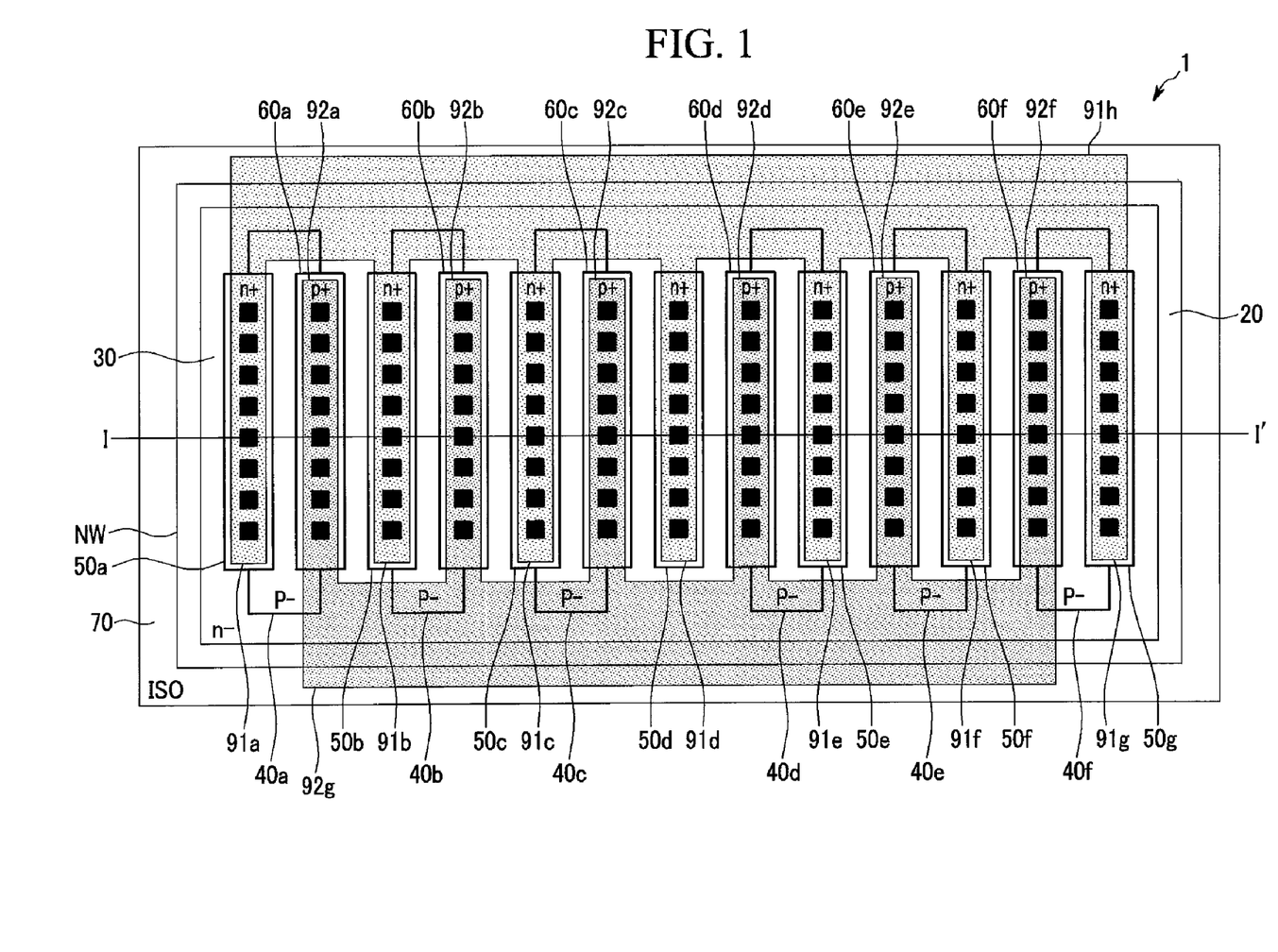
FIG. 1 shows a plane view of an electrostatic discharge diode according to an exemplary embodiment of the present invention.
Figure 2:
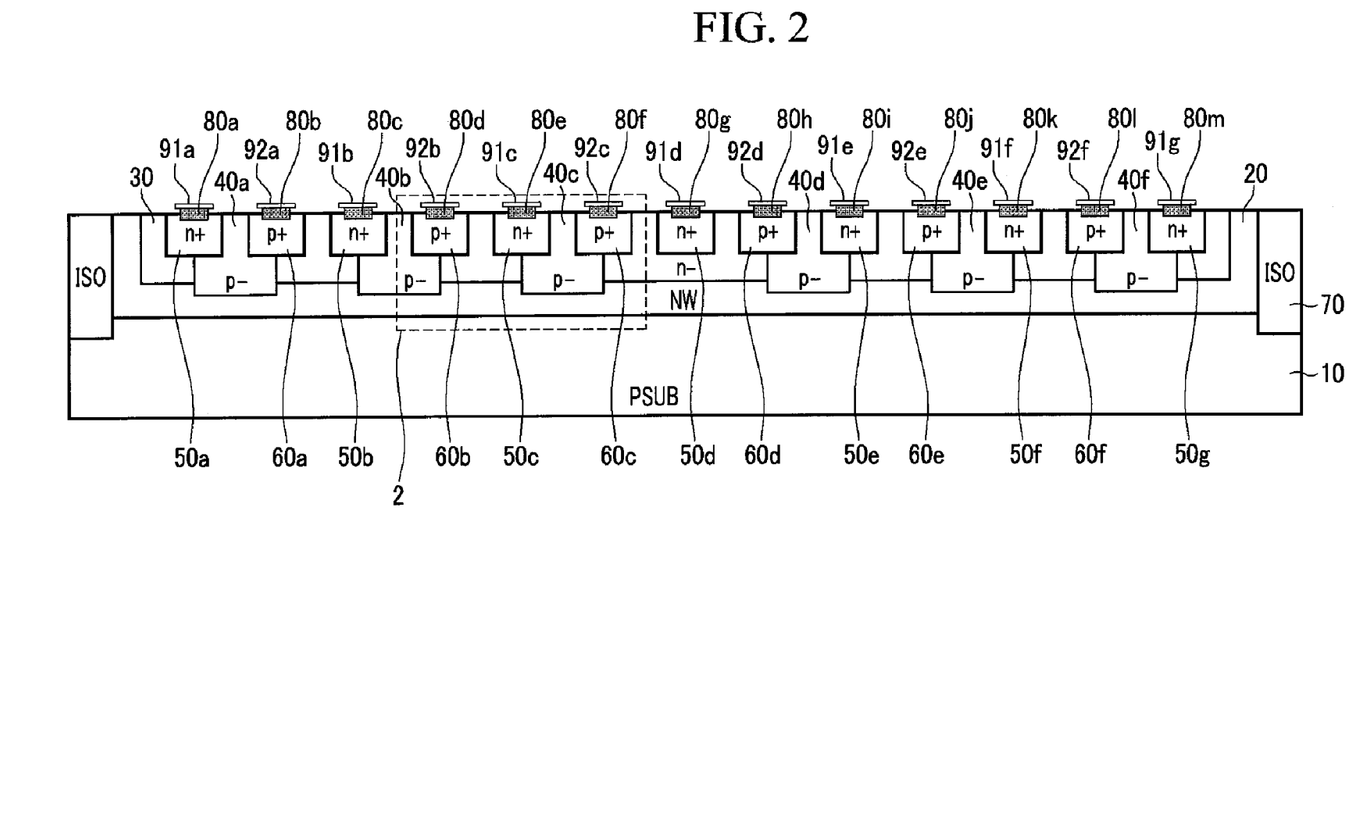
FIG. 2 shows a sectional view cut away along a line I-I' of the electrostatic discharge diode of FIG. 1.
Figure 3:
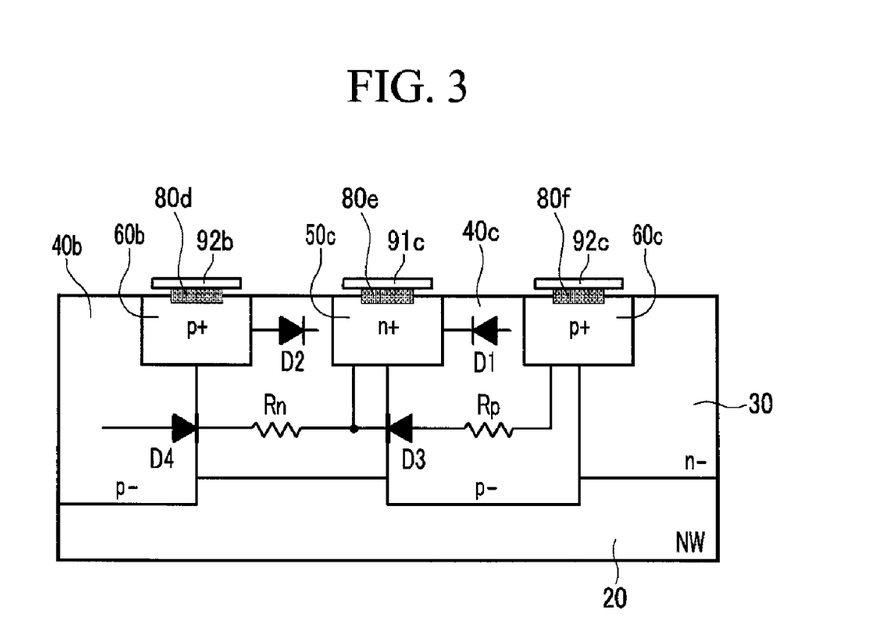
FIG. 3 shows a region 2 of an electrostatic discharge diode including four kinds of diodes according to an exemplary embodiment of the present invention.
Figure 4:
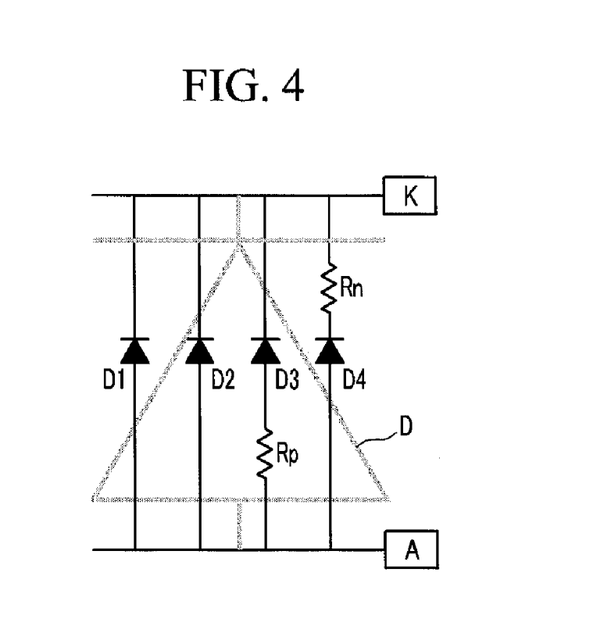
FIG. 4 shows an equivalent circuit diagram of the region 2 shown in FIG. 3.
Figure 5A:
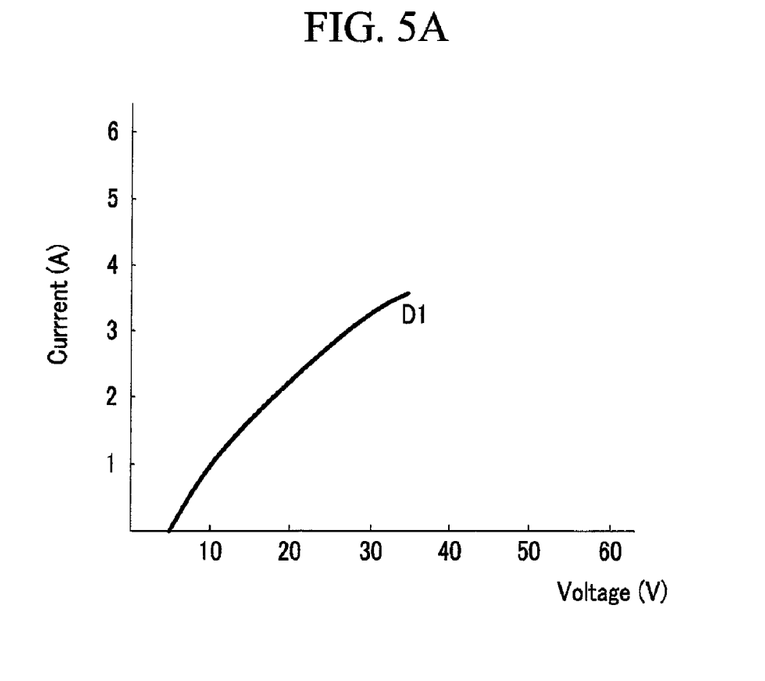
FIG. 5A shows a voltage-current characteristic curve of a diode D1.
Figure 5B:
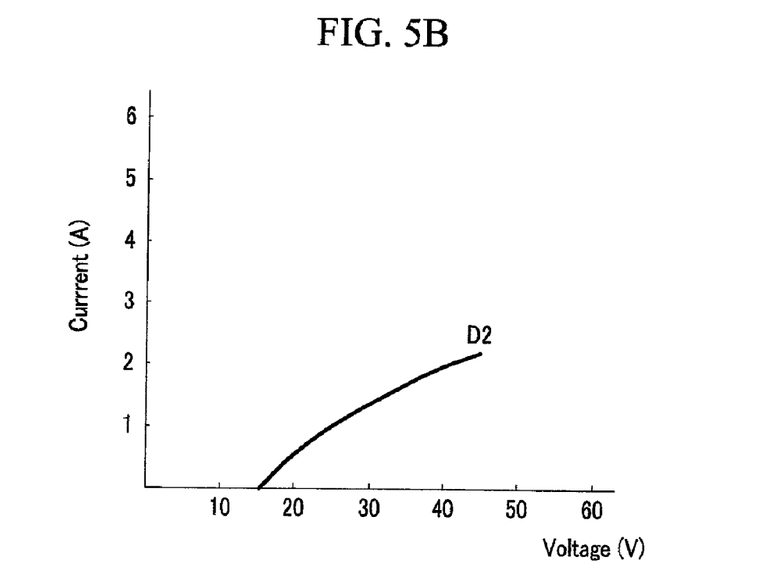
FIG. 5B shows a voltage-current characteristic curve of a diode D2.
Figure 5C:
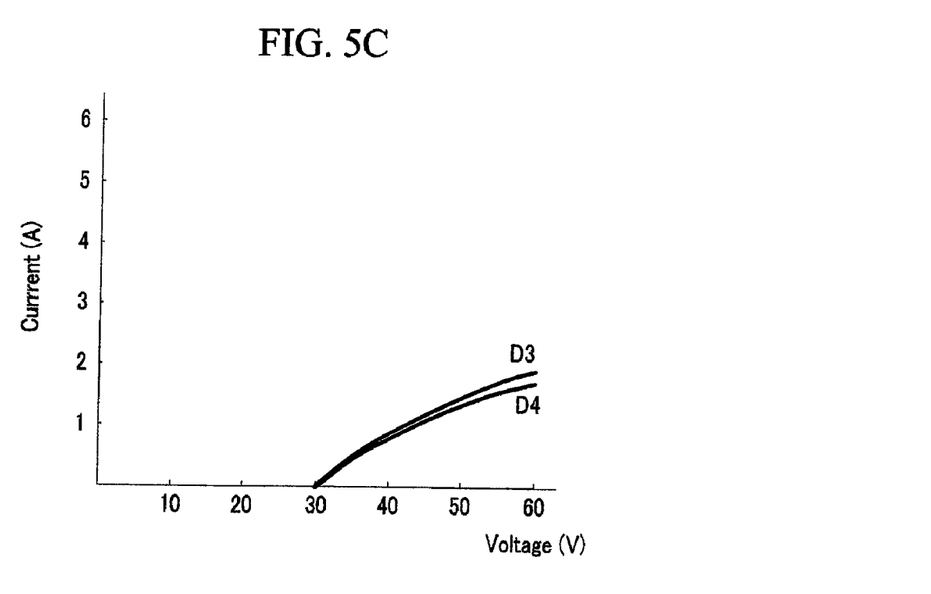
FIG. 5C shows voltage-current characteristic curves of diodes D3 and D4.
Figure 5D:
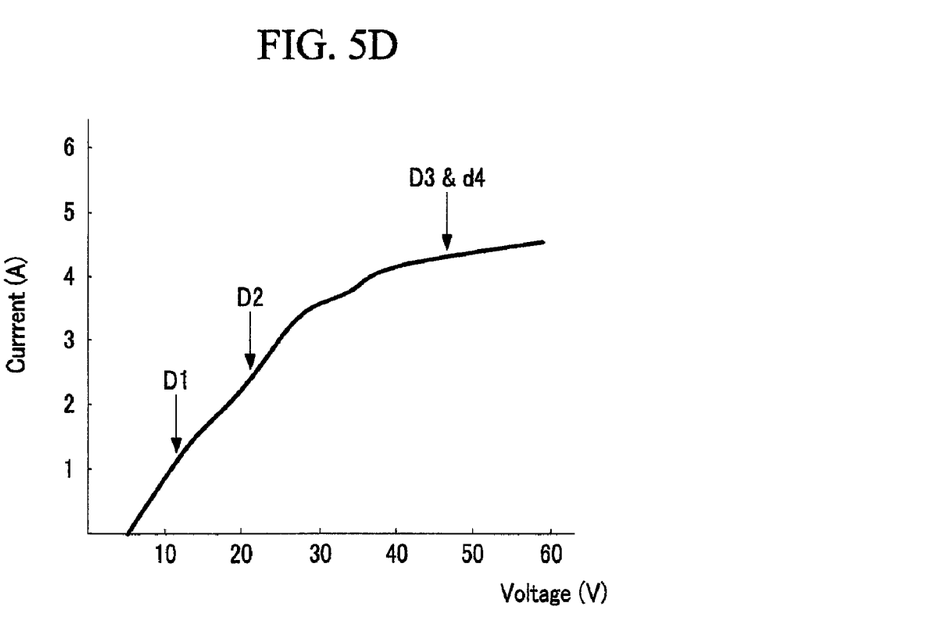
FIG. 5D shows a voltage-current characteristic curve of a electrostatic discharge diode D.
Figure 6:
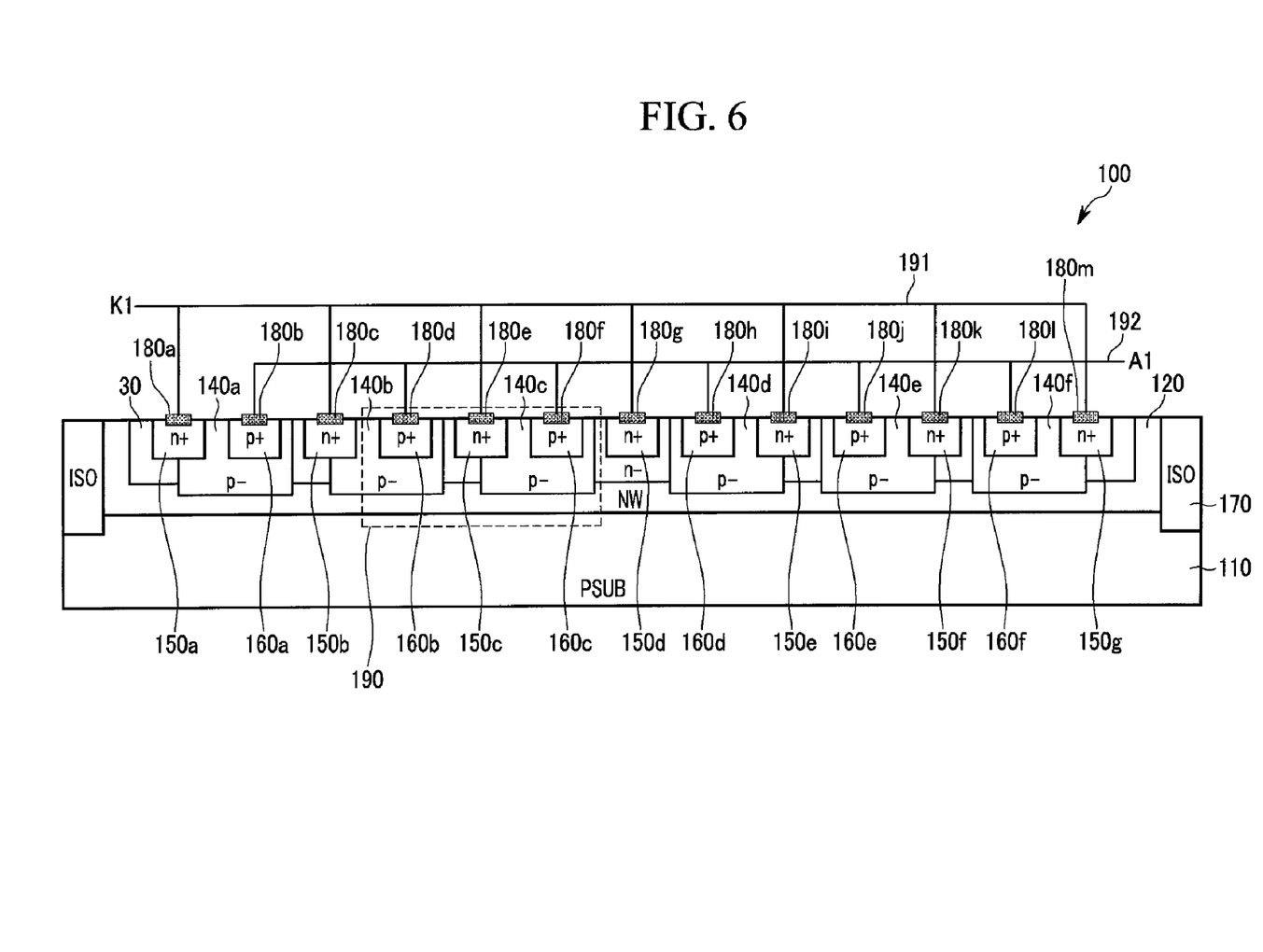
FIG. 6 shows a sectional view of an electrostatic discharge diode according to another exemplary embodiment of the present invention.
Figure 7:
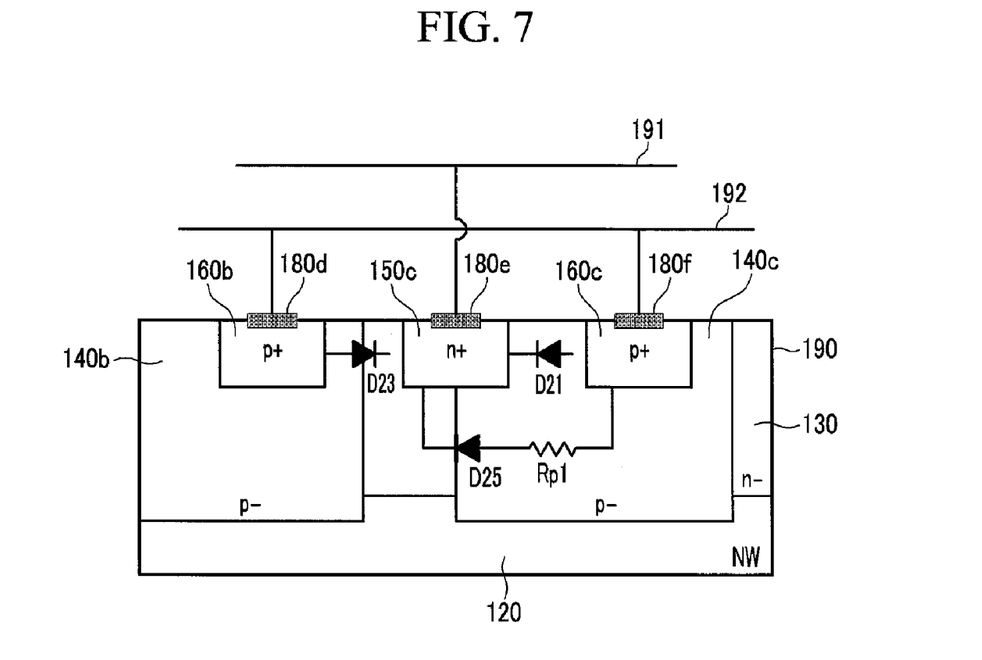
FIG. 7 shows a region 190 of an electrostatic discharge diode 100 including two kinds of diodes according to another exemplary embodiment of the present invention.
Figure 8:
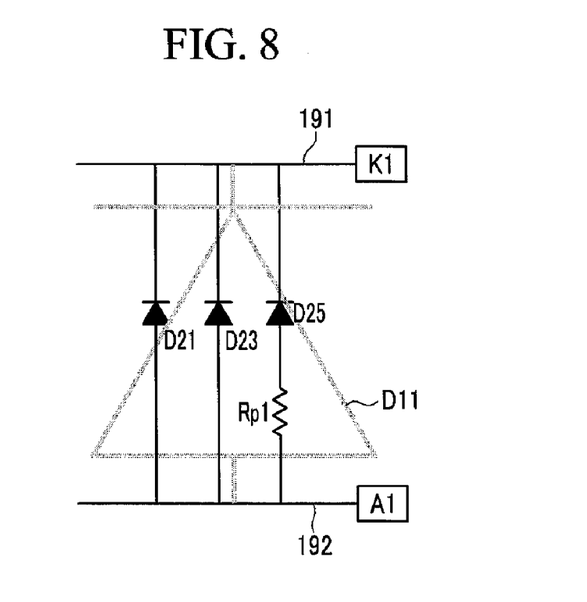
FIG. 8 shows an equivalent circuit diagram of the region 190 shown in FIG. 7.
Figure 9:
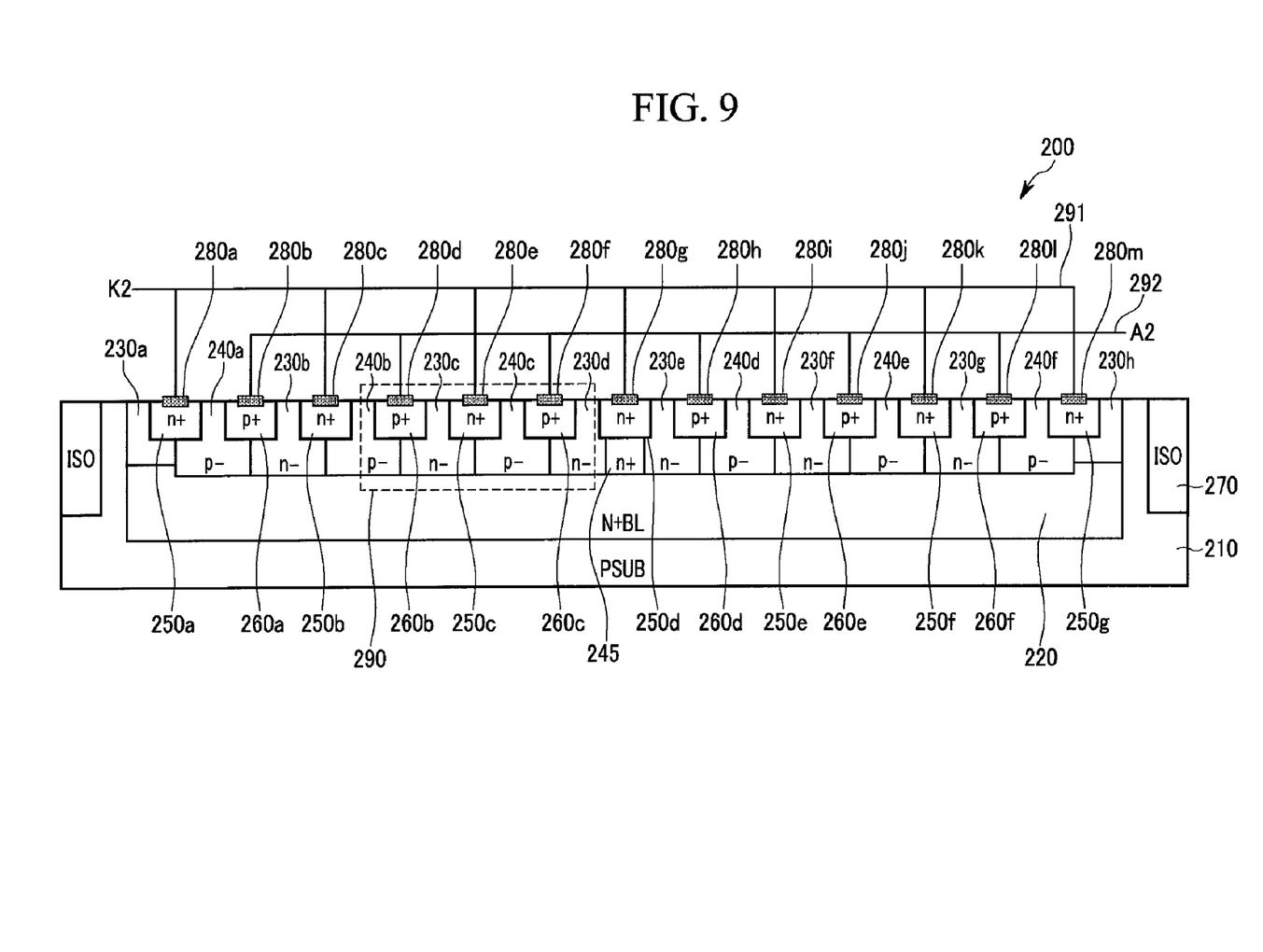
FIG. 9 shows a sectional view of an electrostatic discharge diode 200 according to another exemplary embodiment of the present invention.
Figure 10:
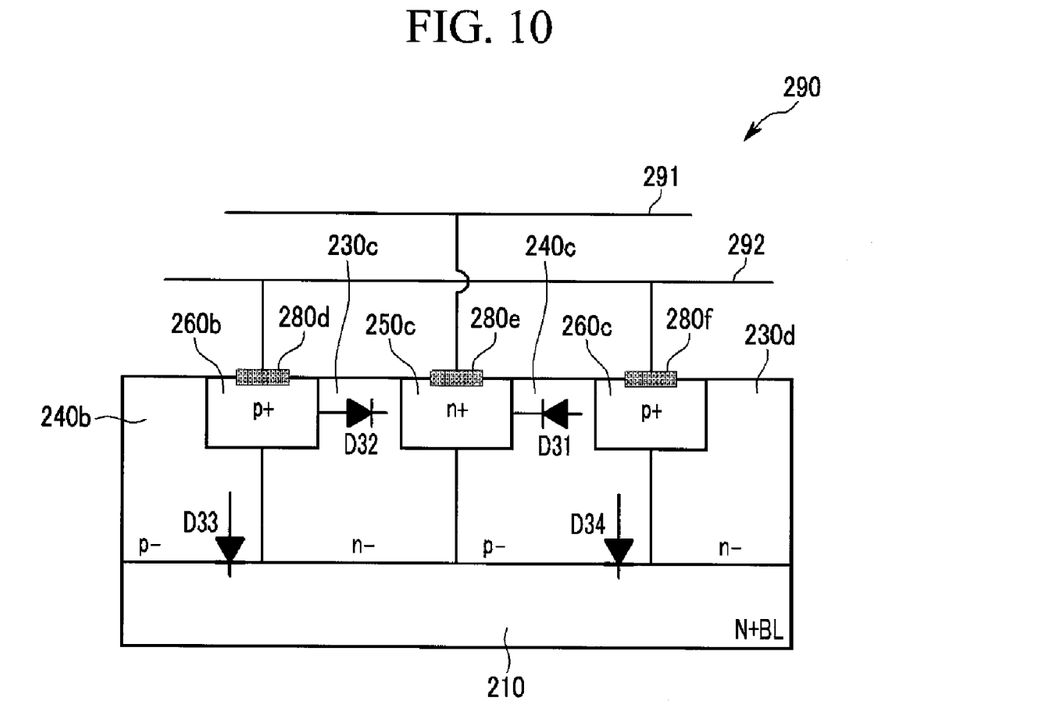
FIG. 10 shows a region 290 of an electrostatic discharge diode 200 including three kinds of diodes according to the other exemplary embodiment of the present invention.
Figure 11:
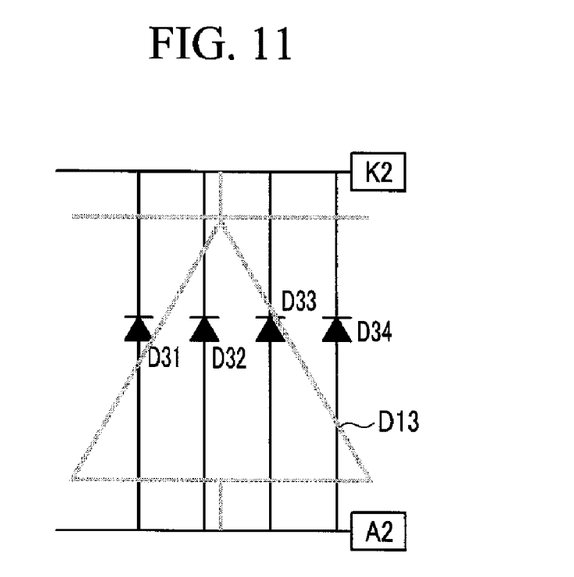
FIG. 11 shows an equivalent circuit diagram of the region 290 shown in FIG. 10.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. Throughout the specification, unless explicitly described to the contrary, the word "comprise" and variations such as "comprises" or "comprising" will be understood to imply the inclusion of stated elements but not the exclusion of any other elements. FIG. 1 shows a plane view of an electrostatic discharge diode according to an exemplary embodiment of the present invention. FIG. 2 shows a sectional view cut away along a line I-I' of the electrostatic discharge diode of FIG. 1. Hereafter, referring to FIG. 1 and FIG. 2, the electrostatic discharge diode according to an exemplary embodiment of the present invention will be described. The electrostatic discharge diode includes an n type well (hereinafter, NW) 20, an n− region 30, p− regions 40a to 40f, n+ cathode regions 50a to 50g, p+ anode regions 60a to 60f, an isolated diffusion unit (hereinafter, ISO) 70, cathodes 91a to 91h, and anodes 92a to 92g. In FIG. 1, black parts are a plurality of electrodes. The ISO 70 is formed in the outer part of the electrostatic discharge diode. Inside the ISO 70, the NW 20 and the n− region 30 are formed in order. In the n− region 30, the p− regions 40a to 40f are penetrated and formed. The n+ cathode regions 50a to 50g and the p+ anode regions 60a to 60f are alternately formed in the n− region 30 and a corresponding p− region of the p− regions 40a to 40f. One of the n+ cathode regions 50a to 50g and a corresponding one of the p+ anode regions 60a to 60f are respectively formed to be apart from each other in a corresponding one of the p− regions 40a to 40f. In the n+ cathode regions 50a to 50g and the p+ anode regions 60a to 60f, a plurality of electrodes (black parts shown in FIG. 1) are formed, respectively. The cathodes 91a to 91g and the anodes 92a to 92f respectively corresponding to the n+ cathode regions 50a to 50g and the p+ anode regions 60a to 60f are overlapped and formed on a plurality of electrodes The cathode electrode 91h is formed in a direction perpendicular to the cathode electrodes 91a to 91g, and connects the cathode electrodes 91a to 91g to electronically form one cathode. The anode electrode 92g is formed in a direction perpendicular to the anode electrodes 92a to 92f and electronically connects the anode electrodes 92a to 92f to one anode. Hereinafter, a sectional view cut away along a line I-I' of the electrostatic discharge diode 1 will be described. A p substrate (PSUB) 10, an NW 20, an n− region 30, p− regions 40a-40f, n+ cathode regions 50a to 50g, p+ anode regions 60a to 60f, the ISO 70, electrodes 80a to 80m, cathode electrodes 91a to 91g, and anode electrodes 92a to 92f are shown in FIG. 2. The NW 20 is formed on the PSUB 10 and the n− region 20 is formed on the NW 20. The p− region 40 is penetrated and formed in the n− region 30 and the NW 20. The n+ cathode regions 50a to 50c and 50e to 50g are respectively penetrated and formed in the n− region 30, and a corresponding p− region of the p− regions 40a to 40f and the n+ cathode region 50d is formed in the n− region 30. The p+ anode regions 60a to 60f are penetrated and formed in the n− region and a corresponding p− region of the p− regions 40a to 40f. The electrodes 80a, 80c, 80e, 80g, 80i, 80k, and 80m are formed in the n+ cathode regions 50a to 50g, and the electrodes 80b, 80d, 80f, 80h, 80j, and 80l are formed in the p+ anode regions 60a to 60g. The cathode electrodes 91a to 91g are respectively formed on the electrodes 80a, 80c, 80e, 80g, 80i, 80k, and 80m, and the anode electrodes 92a to 92f are respectively formed on the electrodes 80b, 80d, 80f, 80h, 80j, and 80l. According to an exemplary embodiment of the present invention, four kinds of diodes in the electrostatic discharge diode 1 are formed. The four diodes will be described in detail, referring to FIG. 3. FIG. 3 shows a region 2 of an electrostatic discharge diode including four kinds of diodes according to an exemplary embodiment of the present invention. FIG. 4 shows an equivalent circuit diagram of the region 2 shown in FIG. 3. As shown in FIG. 3, four kinds of diodes D1 to D4 are formed in the region 2. The diode D1 is formed between a p− region 40c and an n+ region 50c, and the p− region 40c and the n+ region 50c are respectively an anode and a cathode of the diode D1. Since the p− region 40c of the diode D1 is connected to a p+ region 60c, the anode and the cathode of the diode D1 are respectively connected to an electrode 92c and an electrode 91c. The diode D2 is formed between a p+ region 60b and the n− region 30, and the p+ region 60b and the n− region 30 are respectively an anode and a cathode of the diode D2. Since the n– region 30 of the diode D2 is connected to the n+ region 50c, the anode and cathode of the diode D2 are respectively connected to an electrode 92b and the electrode 91c. The diode D3 is formed between the p– region 40c and the n– region 30, and the p– region 40c and the n– region 30 are respectively an anode and a cathode of the diode D3. A resistor Rp is formed between the p+ region 60c and the p– region 40c. The diode D4 is formed between a p– region 40b and the n– region 30, and the p– region 40ba and the n– region 30 are respectively an anode and a cathode of the diode D4. A resistor Rn is formed between the n+ region 50c and the n– region 30. Therefore, the n+ region 50c and the n– region 30 are electronically coupled to each other through the resistor Rn. The diode D3 and the diode D4 are formed between a region having the same doping concentration and have the same trigger voltage. However, the diode D3 and the diode D4 have substantially different controllability by the resistor Rp and the resistor Rn. According to an exemplary embodiment of the present invention, a trigger voltage is a voltage applied between an anode and a cathode of a diode when a current starts to flow through the diode. Since the anode 92b and the anode 92c are connected by the anode 92g, the anode 92b and the anode 92c are the same anode. Therefore, a diode D including the diodes D1-D4 can be equivalently shown as in FIG. 4. As shown in FIG. 4, each anode and each cathode of diodes D1 to D4 is connected to one anode electrode A of the electrostatic discharge diode 1 and one cathode electrode K of the electrostatic discharge diode 1, and form one diode D. The diode D has a new characteristic that is influenced by characteristics of the diodes D1 to D4. FIG. 5A shows a voltage-current characteristic curve of the diode D1. FIG. 5B shows a voltage-current characteristic curve of the diode D2. FIG. 5C shows voltage-current characteristic curves of the diodes D3 and D4. FIG. 5D shows a voltage-current characteristic curve of the diode D. As shown in FIG. 5A, the diode D1 has a trigger voltage of about 5V. Accordingly, when a voltage between the anode A and the cathode K is 5V, the diode D1 is turned on and a current flows. As shown in FIG. 5B, the diode D2 has a trigger voltage of about 15V. Accordingly, when a voltage between the anode A and the cathode K is 15V, the diode D2 is turned on and a current flows. As shown in FIG. 5C, the diodes D3 and D4 have a trigger voltage of about 30V. Accordingly, when a voltage between the anode A and the cathode K is 30V, the diodes D3 and D4 are turned on and a current flows. Each voltage-current characteristic curve of the diode D3 and the diode D4 is different by the resistor Rp and the resistor Rn. Since the diode D1 is turned on at about 5V and a current starts to flow through the diode D1, the diode D is also turned on at about 5V and a current starts to flow through the diode D, as shown in FIG. 5D. In a high voltage region, over a 30V voltage range, an increasing slope of a current flowing through the diode D is low. Accordingly, since the diode D has a low trigger voltage, the diode D can discharge the electrostatic voltage at a low voltage. Further, since the increasing slope is low, the diode D has a low discharge current at a high voltage by electrical surge. Then, the damage such as the dielectric breakdown by an electrical surge can be prevented. The diodes D1 to D4 respectively have different characteristics by each different region in which the diodes D1 to D4 are formed. Particularly, the trigger voltage of the diode D1 is lowest and the trigger voltage of the diodes D3 and D4 is highest. The diode D1 and the diode D2 have low trigger voltages and after triggering the resistors of the diodes D1 and D2 are low, and the electrostatic discharging capabilities of the diodes D1 and D2 are better than those of the diodes D3 and D4. Particularly, since the trigger voltage at the diode D1 is lowest, the diode D1 has the best electrostatic discharging capability. However, the high concentration doped diode as the diodes D1 and D2 has a low thermal breakdown voltage. Therefore, the high concentration doped diode as the diodes D1 and D2 has a very low sustaining voltage when electrical surge occurs at the diodes D1 and D2. On the other hand, the trigger voltages of the low concentration doped diodes D3 and D4 are high. However, the diodes D3 and D4 have a higher thermal breakdown voltage and a high sustaining voltage when electrical surge occurs. According to an exemplary embodiment of the present invention, the diode D includes the high concentration doped diodes D1 and D2 and the low concentration doped diodes D3 and D4. Then, a high discharge current by the electrical surge can be prevented and the low electrostatic voltage can be discharged. Accordingly, a semiconductor circuit is protected from damage caused by a high electrostatic voltage and high discharge current. FIG. 6 shows a sectional view of an electrostatic discharge diode according to another exemplary embodiment of the present invention. According to this exemplary embodiment of the present invention, an electrostatic discharge diode is formed such that a p– region surrounds a p+ region. n+ regions 150a-150g are penetrated and formed in a corresponding p– region of p– regions 140a-140f and an n– region. In FIG. 6, a plurality of cathode electrodes and anode electrodes formed on electrodes 180a to 180m are shown as lines for explanation and illustration convenience. A plurality of the cathode electrodes and anode electrodes are formed according to the above-disclosed exemplary embodiment of the present invention. According to another exemplary embodiment of the present invention, an electrostatic discharge diode 100 includes the diode D1 and the diode D3. The diode D1 and the diode D3 are combined and form a diode D11. As shown in FIG. 6, an NW 120 is formed on a PSUB 110. An n– region 130 is formed on the NW 120. The p– regions 140a-140f are penetrated and formed in the n– region 130. n+ cathode regions 150a to 150c and 150e to 150g are penetrated and formed in the n– region 130 and a corresponding p– region of the p– regions 140a to 140f. An n+ cathode region 150d is formed in the n– region 130. p+ anode regions 160a to 160f are penetrated and formed in the p– regions 140a to 140f. Electrodes 180a, 180c, 180e, 180g, 180i, 180k, and 180m are formed in the n+ cathode regions 150a to 150g. Electrodes 180b, 180d, 180f, 180h, 180j, and 180l are formed in the p+ anode regions 160a to 160f. A cathode 191 is connected to the electrodes 180a, 180c, 180e, 180g, 180i, 180k, and 180m, and forms a cathode electrode K1 of the electrostatic discharge diode 100. An anode 192 is connected to the electrodes 180b, 180d, 180f, 180h, 180j, and 180ln and forms an anode electrode A1 of the electrostatic discharge diode 100. According to another exemplary embodiment of the present invention, two kinds of diodes in the electrostatic are formed in the discharge diode 100. The two kinds of diodes will be described in detail, referring to FIG. 7. FIG. 7 shows a region 190 of the electrostatic discharge diode 100 including two kinds of diodes according to another exemplary embodiment of the present invention. FIG. 8 shows an equivalent circuit diagram of the region 190 shown in FIG. 7. As shown in FIG. 7, two diodes D21 and D23 are formed in the region 190. The diode D21 has the same characteristics as the diode D1. The diode D23 and the diode D25 have the same characteristics as the diode D3. The diode D21 is formed between a p– region 140c and an n+ region 150c. The p– region 140c and the n+ region 150c are respectively an anode and a cathode of the diode D21. Since the p– region 140c of the diode D21 is connected to a p+ region 160c, the anode and the cathode of the diode D21 are respectively connected to an anode electrode 192 and a cathode electrode 191. The diode D23 is formed between a p– region 140b and an n– region 130. The p– region 140b and the n– region 130 are respectively an anode and a cathode of the diode D23. Since the n– region 130 of the diode D23 is connected to the n+ region 150c, the anode and the cathode of the diode D23 are respectively connected to the anode electrode 192 and the cathode electrode 191. The diode D25 is formed between the p– region 140c and the n– region 130. The p– region 140c and the n– region 130 are respectively an anode and a cathode of the diode D25. A resistor Rp1 is formed between the p+ region 160c and the p– region 140c. As shown in FIG. 8, each anode and each cathode of the diodes D21, D23, and D25 is connected to one anode electrode A1 and one cathode electrode K1, and forms one diode D11. The diode D11 has a new characteristic influenced by characteristics of the diodes D21, D23, and D25. As stated above, according to another exemplary embodiment of the present invention, the diode D11 also includes a high concentration doped diode D21 and low concentration doped diodes D23 and D25. Next, referring to FIG. 9 to FIG. 11, other exemplary embodiment of the present invention will be described. FIG. 9 shows a sectional view of an electrostatic discharge diode 200 according to another exemplary embodiment of the present invention. According to this exemplary embodiment of the present invention, the electrostatic discharge diode is formed such that n– regions are formed separately, different from that according to the above-disclosed exemplary embodiments of the present invention. p+ regions 260a-260f and n+ regions 250a-250g are penetrated and formed in a corresponding p– region of p– regions 240a-240f and a corresponding n– region of n– regions 230a-230f. In FIG. 9, a plurality of cathode electrodes and anode electrodes formed on electrodes 280a to 280m are shown as lines for explanation and illustration convenience. A plurality of the cathode electrodes and anode electrodes are formed according to the above-disclosed exemplary embodiments of the present invention. As shown in FIG. 9, an N+ BL (blocking layer) 220 is formed on a PSUB 210. n– regions 230a to 230h and p– regions 240a to 240f are formed on the N+ BL 220. n+ cathode regions 250a to 250c and 250e to 250g are penetrated and formed in a corresponding p– region among the p– regions 240a to 240c and 240d to 240f, and a corresponding n– region among the n– regions 230a to 230c and 230f to 230h. An n+ cathode region 250d is penetrated and formed on a n+ region 245, and is formed near to the n– regions 230d and 230e. p+ anode regions 260a to 260f are formed in one corresponding n– region among the n– regions 230b to 230g and in a corresponding p– region among the p– regions 240a to 240f. The electrodes 280a, 280c, 280e, 280g, 280i, 280k, and 280m are formed in the n+ cathode regions 250a to 250g. The electrodes 280b, 280d, 280f, 280h, 280j, and 280l are formed in the p+ anode regions 260a to 260f. A cathode 291 connects with the electrodes 280a, 280c, 280e, 280g, 280i, 280k, and 280m and forms a cathode electrode K2 of a electrostatic discharge diode 200. An anode 292 connects the electrodes 280b, 280d, 280f, 280h, 280j, and 280l and forms an anode electrode A2 of the electrostatic discharge diode 200. Since an N+ BL 220 has a higher doping concentration than the n– region, the resistor is low. Accordingly, it is necessary to disperse a current flowing through the diode formed between the p– region and the N+ BL 220. The n+ region 245 is formed on a center of the N+ BL 220, and causes the current flowing through the diode to be dispersed. According to this exemplary embodiment of the present invention, three kinds of diodes in the electrostatic discharge diode 200 are formed. The three kinds of diodes will be described in detail, referring to FIG. 10. FIG. 10 shows a region 290 of an electrostatic discharge diode 200 including three kinds of diodes according to this exemplary embodiment of the present invention. FIG. 11 shows an equivalent circuit diagram of the region 290 shown in FIG. 10. As shown in FIG. 10, four diodes D31, D32, D33, and D34 are formed in the region 290. The four diodes D31, D32, D33, and D34 can be classified as three kinds. The diode D31 has the same characteristics as the diode D1, the diode D32 has the same characteristics as the diode D2, and the diodes D33 and D34 have similar characteristics to the diode D3. The diodes D33 and D34 formed between the p– regions 240b and 240c and the N+ BL have same characteristics, and are designed to have similar thermal breakdown to the above-disclosed diodes D3 and D4 and to have similar trigger voltages. The diode D31 is formed between the p– region 240c and the n+ region 250c. The p– region 240c and the n+ region 250c are respectively an anode and a cathode of the diode D31. Since the p– region 240c of the diode D31 is connected to the p+ region 260c, the anode and the cathode of the diode D31 are respectively connected to the anode electrode 292 and the cathode electrode 291. The diode D32 is formed between the p+ region 260b and the n– region 230c. The p+ region 260b and the n– region 230c are respectively an anode and a cathode of the diode D32. Since the n– region 230c of the diode D32 is connected to the n+ region 250c, the anode and the cathode of the diode D32 are respectively connected to the anode electrode 292 and the cathode electrode 291. The diode D33 is formed between the p– region 240b and the N+ BL 220. The p– region 240b and the N+ BL 220 are respectively an anode and a cathode of the diode D33. Since the p– region 240b of the diode D33 is connected to the p+ region 260b, the anode electrode 292 is connected to the p– region 240b. The N+ BL 220 is connected to the cathode 292 through the n+ region 245 and the n+ region 250d. Accordingly, the anode and the cathode of the diode D33 are respectively connected to the anode electrode 292 and the cathode electrode 291. The diode D34 is formed between the p– region 240c and the N+ BL 220. The p– region 240c and the N+ BL 220 are respectively an anode and a cathode of the diode D34. Since the p– region 240c of the diode D34 is connected to the p+ region 260c, the anode 292 is connected to the p– region 240c. The N+ BL 220 is connected to the cathode electrode 291 through the n+ region 245 and the n+ region 250d. Accordingly, the anode and the cathode of the diode D34 are respectively connected to the anode 292 and the cathode 291. As shown in FIG. 11, the anodes and the cathodes of the diodes D31, D32, D33, and D34 are connected with one anode electrode A2 and one cathode electrode K2, and they form one diode D13. The diode D13 has new characteristics by adding characteristics of the diodes D31 to D34. According to this exemplary embodiment of the present invention, the diode D13 also includes high concentration doped diodes D31 and 32 and low concentration doped diodes D33 and D34. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrostatic discharge diode comprising:
an N-type well formed on a substrate;
an n– region formed in the N-type well;
a plurality of p– regions formed in the n– region;
a plurality of n+ regions formed in a first layer in which the n– region and a plurality of the p– regions are formed; and a plurality of p+ regions formed in the first layer,
wherein a first n+ region among the plurality of n+ regions and a first p+ region among the plurality of p+ regions are formed across a boundary of a first p− region among the plurality of p− regions.

2. The electrostatic discharge diode of claim 1, wherein each of the plurality of n+ regions is formed in the n− region and a p− region among the plurality of p− regions, and each of the plurality of p+ regions is formed in the n− region and a p− region among the plurality of p− regions.

3. The electrostatic discharge diode of claim 2, wherein a first diode is formed between the first p− region and the first n+ region, and a second diode is formed between the first p− region and the n− region.

4. The electrostatic discharge diode of claim 3, wherein a third diode is formed between a second p+ region that is near the first n+ region and the n− region, and a fourth diode is formed between a second p− region in which a portion of the second p+ region is formed and the n− region.

5. The electrostatic discharge diode of claim 4, wherein a trigger voltage at the first diode is higher than a trigger voltage at the third diode, which is higher than trigger voltages at the second and fourth diodes.

6. The electrostatic discharge diode of claim 4, wherein the first p+ region and the second p+ region are connected to each other.

7. The electrostatic discharge diode of claim 4, wherein a first resistor is formed between the first n+ region and the n− region, and a second resistor is formed between the first p+ region and the first p− region.

8. The electrostatic discharge diode of claim 1, wherein the plurality of n+ regions is formed in the n− region and a p− region among the plurality of p− regions, and p+ regions in the plurality of p+ regions are respectively formed in a p− region among the plurality of p− regions.

9. The electrostatic discharge diode of claim 8, wherein a first diode is formed between the first p− region and the first n+ region, and a second diode is formed between the first p− region and the n− region.

10. The electrostatic discharge diode of claim 9, wherein a third diode is formed between a second p− region in which a second p+ region near the first n+ region is formed and the n− region.

11. The electrostatic discharge diode of claim 10, wherein a trigger voltage of the first diode is higher than trigger voltages of the second and third diodes.

12. The electrostatic discharge diode of claim 10, wherein the first p+ region and the second p+ region are connected to each other.

13. The electrostatic discharge diode of claim 10, wherein a first resistor is formed between the first p+ region and the first p− region.

14. A electrostatic discharge diode comprising:
an N+ BL (Blocking Layer) formed on a substrate;
a plurality of n− regions formed on the N+ BL;
a plurality of p− regions formed on the N+ BL and alternately formed with the plurality of n− regions in a horizontal direction;
a plurality of n+ regions formed in a first layer in which the plurality of n− regions and the plurality of p− regions are formed; and
a plurality of p+ regions formed in the first layer,
wherein an n+ region among the plurality of n+ regions is formed on the N+ BL and formed across a boundary of a p− region among the plurality of p− regions.

15. The electrostatic discharge diode of claim 14, wherein a first n+ region among the plurality of n+ regions is formed from a first n− region among the plurality of n− regions to a first p− region that is near the first n− region.

16. The electrostatic discharge diode of claim 15, wherein a first diode is formed between the first p− region and the first n+ region, and a second diode is formed between the first p− region and the N+ BL.

17. The electrostatic discharge diode of claim 16, wherein a first p+ region, which is near the first n+ region among the plurality of p− regions, is formed from a second n− region near the first p− region to the first p− region, and a second p+ region among the plurality of p+ regions is formed from a second p− region near the first n− region to the first n− region.

18. The electrostatic discharge diode of claim 17, wherein a third diode is formed between the second p+ region and the first n− region, and a fourth diode is formed between the second p− region and the N+ BL.

19. The electrostatic discharge diode of claim 18, wherein a trigger voltage of the first diode is higher than a trigger voltage of the third diode, which is higher than trigger voltages of the second and fourth diodes.

20. The electrostatic discharge diode of claim 18, wherein the first p+ region and the second p+ region are connected to each other.

* * * * *